US006167781B1

(12) United States Patent
Madsen et al.

(10) Patent No.: US 6,167,781 B1
(45) Date of Patent: Jan. 2, 2001

(54) SYSTEM AND APPARATUS FOR RETAINING POSITION OF CAM FOLLOWER

(75) Inventors: Brent Madsen, Providence; Ryan Kunz, Roy; David Oliphant, West Valley; Dexter Francis, Salt Lake City, all of UT (US); Josh Randall, Crystal, MN (US)

(73) Assignee: 3Com Corporation, Santa Clara, CA (US)

( * ) Notice: Under 35 U.S.C. 154(b), the term of this patent shall be extended for 0 days.

(21) Appl. No.: 09/201,682

(22) Filed: Nov. 30, 1998

(51) Int. Cl.[7] ........ F16H 53/00; F16H 53/06; H01R 12/00; H05K 1/00

(52) U.S. Cl. ........ 74/569; 74/567; 439/55

(58) Field of Search ........ 74/567–569; 351/113, 351/114, 153; 341/20; 439/55, 621; 248/244

(56) References Cited

U.S. PATENT DOCUMENTS

| | | | | |
|---|---|---|---|---|
| 2,345,650 | * | 4/1944 | Attwood | 248/244 |
| 3,802,725 | * | 4/1974 | Hill | 292/93 |
| 5,183,404 | * | 2/1993 | Aldous et al. | 439/55 |
| 5,428,982 | * | 7/1995 | Hinterlechner et al. | 72/408 |
| 5,543,787 | * | 8/1996 | Karidis et al. | 341/20 |
| 5,959,715 | * | 9/1999 | Jaffelin | 351/113 |

* cited by examiner

*Primary Examiner*—Vinh T. Luong
(74) *Attorney, Agent, or Firm*—Workman, Nydegger & Seeley

(57) ABSTRACT

An apparatus for providing a guide and positioning mechanism for dictating retraction motion of a retractable member such as a retractable media jack. The apparatus is comprised of a "J-shaped" cam follower having a short end press-fit into a cam pushing with the longer end of the cam follower tracing out the path boundaries as dictated by a groove within a cam track. The cam bushing is comprised of a generally cylindrical cam axle through with the short end of the cam follower passes and an extended wedge-shaped extension for providing support to the extended longer portion of the cam follower. The longer portion of the cam follower is rotationally bounded by stops on each end of the wedge-shaped extension on the cam axle which keeps the long end of the cam follower radially bounded as the cam follower traces a catch and release path of the cam track during extension and retraction of the retractable member.

51 Claims, 2 Drawing Sheets

SYSTEM AND APPARATUS FOR RETAINING POSITION OF CAM FOLLOWER

BACKGROUND OF THE INVENTION

1. The Field of the Invention

The present invention relates to the field of computers. More particularly, it relates to an interface between a connector and a communications card in a computer system, and specifically to a physical/electrical media connector interface for use with a PCMCIA-architecture communications card, such as used in laptop and notebook computers.

2. The Prior State of the Art

Many communication cards have means of interfacing with a media connector. The interface, or media jack, between the communication card and the media connector is typically retractable meaning that when the media jack is in use, it is extended out from the body of the communication card and when the media jack is not being used, it is retracted into the communication card.

The retractability of the media jack is accomplished by using a small rod, also called a cam follower, which follows a cam track as the media jack is extended and retracted. The cam follower is held in place by the media jack, but can move rotationally. The ability to rotate permits the cam follower to change position as it follows the cam track. The cam track guides the cam follower to certain positions as the media jack is extended or retracted.

In order for the described system to function, the cam follower must not only be able to rotate, but also capable of being held in a certain position. If the cam follower were to rotate freely, the media jack would no longer be able to be held in an extended or retracted position. Thus, while the cam track provides the necessary force to move the cam follower rotationally, the cam follower is held in place by a spring when the cam track is not acting on the cam follower.

The spring has two functions. First, the spring pushes against the media jack such that the media jack is held securely in an extended position. Second, the spring prevents the cam follower from rotating freely. Free rotation of the cam follower is prevented by placing one end of the spring against the body of the cam follower. The force of the spring against the cam follower holds the cam follower in the position dictated by the shape of the cam track. In this manner, the goal of retaining the media jack in a retracted position may be accomplished. In other words, the cam track guides the cam follower to a position that will keep the media jack retracted in the communications card. This design may be improved because of several reasons.

First, the cam follower and the spring are in constant contact and the cam follower continually rotates as the media jack is extended and retracted. This constant movement ultimately produces wear on the cam follower. As the wear increases, the ability of the spring to provide sufficient force to prevent the cam follower from freely rotating declines. In other words, if the cam follower is permitted to freely rotate then the media jack is no longer capable of being extended and retracted with regularity and if the media jack cannot be extended, the communications card is essentially useless. Likewise, if the media jack cannot be held in a retracted positon, the media jack is more likely to break, which renders the communications card useless.

Second, the cam follower is inserted into the side of the media jack and is only held in that position while the media jack is connected to the communications card. If the media jack were inadvertently or purposely removed from the communications card, it is likely that the cam follower would fall out of the media jack. The cam follower is very small and is unlikely to be found if it falls out of the media jack. If the cam follower is not found, then the media jack, when reconnected to the communications card, will remain in an extended position and is not capable of being retracted.

SUMMARY AND OBJECTS OF THE INVENTION

The present invention solves the problems evident in the prior art by using a cam bushing and changing the design of the cam follower. The cam track is essentially the same, but the physical design of the media jack is altered to accommodate and connect to the cam bushing.

In the present invention, a spring is no longer used to maintain the orientation of the cam follower. Rather, a cam bushing is used. The cam bushing acts as a bearing, which permits the cam follower to rotate as it is reoriented by the path of the cam track. The rotational orientation of the cam follower is maintained by the friction between the cam follower and the cam bushing. In other words, part of the cam follower is inserted into the cam bushing and the cam follower rotates about this axis. The fit between the cam bushing and the cam follower provides sufficient friction such that the cam follower will not rotate freely but may be reoriented by the cam track.

The problem of the cam follower falling out of the media connector is also solved by the present invention. The cam bushing is designed such that it has a compression fit with the media jack. The compression fit is designed such that the cam follower may still rotate, but the cam bushing will not fall out of the media jack. Because the small cam follower is connected to the cam bushing, the cam follower will likewise not fall out and be lost.

It is therefore an object of the present invention to prevent a cam follower from falling out of a media connector.

It is yet another object of the present invention to securely attach the cam bushing to the media jack.

It is a further object of the present invention to ensure proper orientation of the cam follower.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Figure 1:
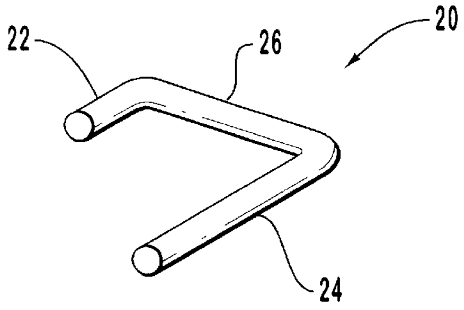
FIG. 1 is a perspective view of a cam follower.
Figure 2:
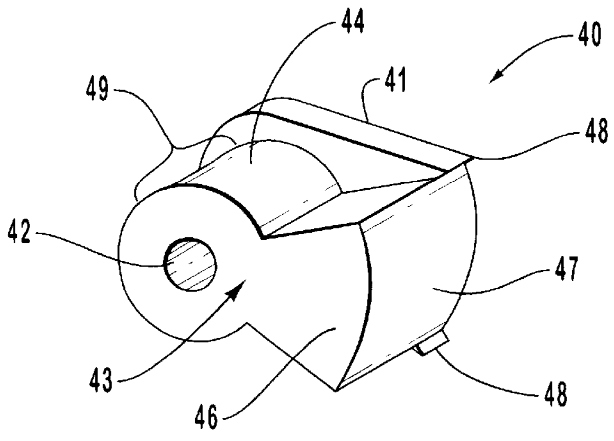
FIG. 2 is a perspective view of a cam bushing.

A system is provided that combines the cam bushing with other parts such that the position of the cam follower is maintained. The cam bushing and the related parts are shown in FIGS. 1 through 4. FIGS. 1 and 2 will be described in terms of their structure, while FIGS. 3 and 4 will be described in terms of function.

FIG. 1 is a perspective view of a cam follower 20. Cam follower 20 has a short arm 22 and a long arm 24 connected by a bar 26. Cam follower 20 is generally U-shaped and is generally made of metal. The ratio of the length of short arm 22 to the length of long arm 24 can be varied as needed. The function of cam follower 20 is discussed in connection with FIGS. 3 and 4.

FIG. 2 is a perspective view of a preferred embodiment of a cam bushing 40. Cam bushing 40 is comprised of the following parts: a back 43 including a cam axle 44 and a cam sill 46, an aperture 42, an arm stop 48, a front 41, a generally curved top surface 47, and an axle length 49. Cam axle 44 is preferably cylindrical in shape. Aperture 42 is preferably located in cam axle 44 and is preferably cylindrical in shape. Cam sill 46 has a curved surface and arm stop 48 extends up on both sides of cam sill 46. Front 41 is substantially flat. The shape and function of cam bushing 40 is discussed in connection with FIGS. 3 and 4.

Figure 3:
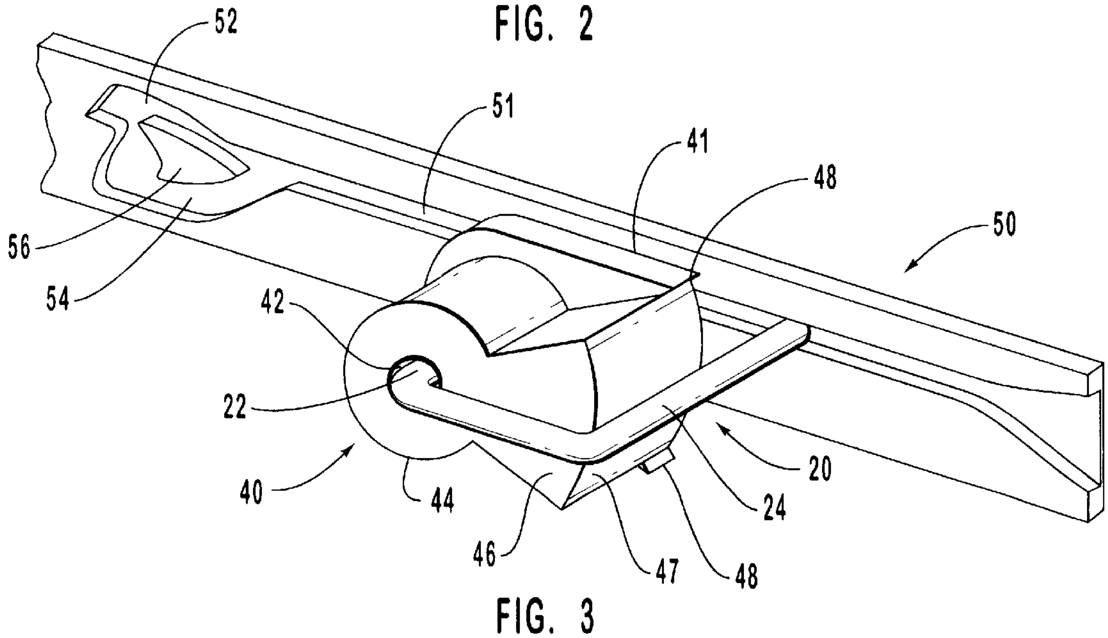
FIG. 3 is a perspective view of the cam follower connected to the cam bushing and the cam track.

FIG. 3 is a perspective view of a cam track 50 along with a perspective view of cam bushing 40 coupled with cam follower 20. In the embodiment of the invention shown in FIG. 3, short arm 22 is inserted into aperture 42. Aperture 42 is configured to receive short arm 22 and aperture 42 has substantially the same shape as short arm 22. The friction between short arm 22 and aperture 42 prevents cam follower 20 from rotating in aperture 42. Note that aperture 42 may have any suitable shape that creates sufficient friction to prevent short arm 22 from rotating in aperture 42. By the same token, short arm 22 may have any suitable shape that permits rotation. It is possible that short arm 22 and aperture 42 do not have substantially the same shape. In the preferred embodiment, however, short arm 22 and aperture 42 have substantially the same shape. The friction between short arm 22 and aperture 42 prevents short arm 22 from rotating freely. In other words, cam bushing 40 is designed to prevent cam follower 20 from freely rotating in aperture 42 Note that short arm 22 may rotate in aperture 42 when acted upon by an external force. In fact, it is necessary for cam follower 20 to rotate about short arm 22 when cam follower 20 is coupled with cam bushing 40.

Cam track 50 provides the means or external force for rotating cam follower 20 about short arm 22. When short arm 22 is fully inserted into aperture 42, long arm 24 extends past front 41. Cam bushing 40 is oriented such that the portion of long arm 42 that extends past front 41 rests in a groove 51. As cam bushing 40 is moved alongside cam track 50 in a parallel fashion, groove 51 provides an external force which pushes against long arm 24. This external force against long arm 24 causes cam follower 20 to rotate about short arm 22 while the friction between short arm 22 and aperture 42 prevents cam follower 20 from rotating freely.

The motion of cam bushing 40 relative to cam track 50 is as follows. The direction of cam bushing 40 will be described in terms of left and right to correspond to FIG. 3. First, cam bushing 40, with the end of long arm 24 in groove 5l, moves left towards a catch 56. Cam track 50 is designed such that as cam follower 20 moves toward catch 56, long arm 24 will follow a catch path 52. As long arm 24 reaches the bottom of catch path 52, long arm 24 is reoriented by the shape of catch path 52. Then cam bushing 40 is moved towards the right. Due to the reorientation of long arm 24, catch 56 prevents cam bushing 40 from moving any further to the right. Cam bushing 40 is then moved to the left. As cam bushing 40 moves to the left, the shape of a release path 54 reorients long arm 24. When cam bushing 40 is moved to the right, long arm 24 is oriented such that long arm 24 follows release path 56. Cam bushing 40 is now free to move to the right and as cam bushing moves to the right, the shape of groove 51 again moves long arm 24 such that when cam bushing 40 is moved to the left, the above process will occur again. This process is continually repeated as needed. The purpose of this design is to permit media jack 60, shown in FIG. 4 and connected to cam bushing 40, to be extended and retracted. When cam bushing 40 is prevented from moving to the right by catch 56, media jack 60 is retracted. When cam bushing is moved to the right, media jack 60 is extended.

As further demonstrated in FIG. 3, when cam follower 20 is coupled with cam bushing 40 by inserting short arm 22 in aperture 42, long arm 24 is positioned above cam sill 46. In the preferred embodiment, cam sill 46 extends up from cam axle 44. Cam sill 44, however, need not be physically connected to cam axle 44. Cam sill 46 has a generally curved top surface 47.

Top surface 47 of cam sill 46 has at least two functions. First, top surface 47 prevents long arm 24 from bending or becoming oriented incorrectly. Long arm 24 of cam follower 20 is small and flexible and the absence of cam sill 46 would allow long arm 24 to bend. If long arm 24 is allowed to bend, then catch 56 will not be able to prevent cam bushing 40 from moving to the right. In other words, cam sill 46 keeps long arm 24 rigid and ensures that cam bushing 40 is kept in a retracted position.

The second function of top surface 47 of cam sill 46 is to permit cam follower 20 to rotate about short arm 22. Because short arm 22 is held stationary by aperture 42, short arm 22 becomes an axis about which cam follower 20 rotates. When cam follower 20 rotates, long arm 24 traces an arc as it moves along top surface 47. Cam sill 46 is designed to allow cam follower 20 to rotate. For this reason, top surface 47 of cam sill 46 is generally curved but can be of any suitable shape. In sums cam sill 46 can be any shape that allows long arm 24 to rotate about short arm 22 and prevents long arm 24 from bending and losing its orientation in cam track 50, or more specifically groove 51, catch path 52 and release path 54.

Top surface 47 has arm stop 48 located at either side extending up from top surface 47. Arm stop 48 prevents long arm 24 from rotating too far in either direction. Arm stop 48 may extend along the entire side of top surface 47, or may extend along only a portion of top surface 47 as illustrated in FIG. 3.

Figure 4:
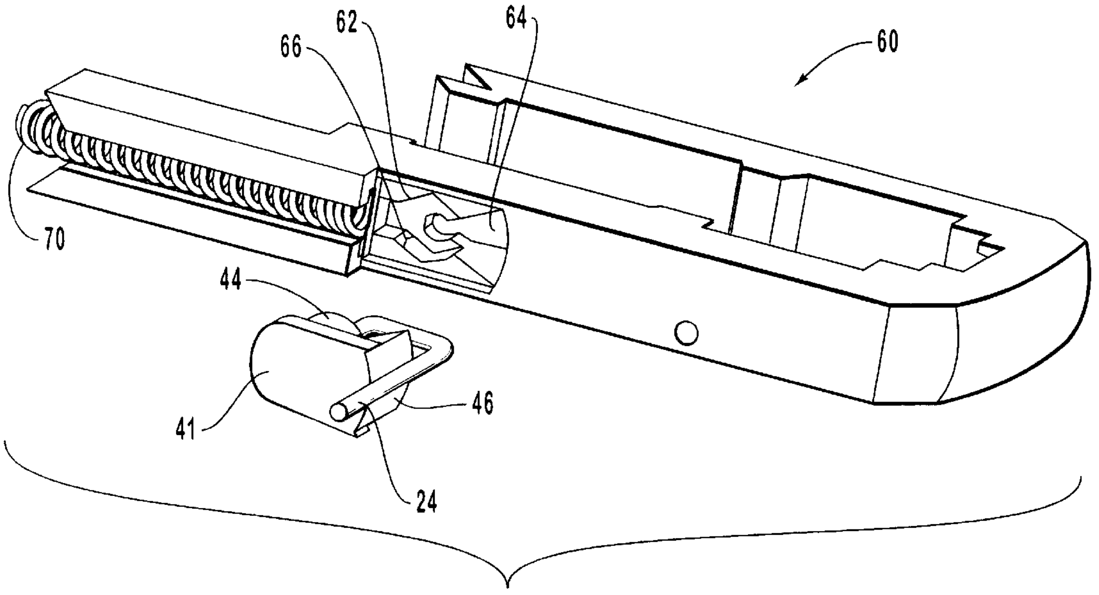
FIG. 4 is a perspective view of the cam follower, the cam bushing and the media jack.

FIG. 4 is a perspective view of a media jack 60 and a perspective view of cam bushing 40 coupled with cam follower 46. FIG. 4 also illustrates how cam bushing 40 connects to media jack 60. Cam bushing 40 connects to media jack 60 via a recess 62. Recess 62 is preferably hexagonal in shape and has a depth 66 depth to receive cam axle 44, which is preferably cylindrical in shape. Axle length 49 of cam axle 44, as shown in FIG. 1, is sufficient to permit a secure compression fit with recess 62. Cam length 49 is substantially and preferably the same as depth 66. Recess 62 and cam axle 44 are compressed together such that cam bushing 40 is securely connected to media jack 60. The respective shapes of cam axle 44 and recess 62 can vary, as long as cam bushing 40 is securely connected to media jack 60. This connection may be accomplished by a compression fit as illustrated in FIG. 4, or by any other equivalent means.

A trough 64 is connected to recess 62. Trough 64 is designed to provide space beneath recess 62 such that cam follower 20 may rotate in cam bushing 40. The shape of recess 62 and trough 64 is substantially the same as the shape of cam axle 44 and cam sill 46. The major differences between the two shapes is that recess 62 is configured to form a compression fit with cam axle 44 and trough 64 is designed to permit cam follower 20 to rotate while cam bushing 40 is securely connected to media jack 60. When cam bushing 40 is connected securely to media jack 60, front 41 of cam bushing 40 is substantially flush with the side of media jack 60. Also, long arm 24 extends from the side of media jack 60 Long arm 24 is capable of rotating about short arm 22 and follows cam track 50, as shown in FIG. 3, as media jack 60 is extended and retracted in a communications card. Note that a spring 70 ensures that media jack 60 will be securely held in one of two positions. Media jack is either fully extended by spring 70 or media jack 60 is retracted because, as illustrated in FIG. 3, long arm 24 is against catch 56 and in this manner spring 70 is prevented from extending media jack 60. Note that the absence of cam sill 46 would allow the force of spring 70 to bend long arm 24, which would prevent media jack 60 from being held in a retracted position.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A system comprising:

a cam follower having a short arm and a long arm;

a cam bushing having a back and a flat front, wherein the back includes:

a cam axle extending from the back having an aperture configured to receive the short arm such that the short arm may rotate; and a cam sill extending from the back, wherein the cam sill has a curved surface having opposing sides, wherein each side has a stop, wherein the curved surface describes an arc in relation to the aperture; and a cam track having a groove, the groove being configured to receive the long arm such that the long arm follows the groove.

2. A system as in claim 1, wherein the cam axle is cylindrical in shape and has an aperture.

3. A system as in claim 2, wherein the aperture is substantially the same shape as the short arm.

4. A system as in claim 1, wherein the cam axle is configured to securely hold the short arm by friction while allowing the short arm to rotate when an external force is applied to the cam follower.

5. A system as in claim 1, wherein the cam sill has a generally curved surface.

6. A system as in claim 1, wherein the groove further comprises a catch path, wherein the catch path reorients the long arm and guides the cam bushing to a retracted.

7. A system as in claim 1, wherein the groove further comprises a release path, wherein the release path reorients the long arm and guides the cam bushing to an extended position.

8. A system as in claim 1, wherein the cam track further comprises a catch, wherein the catch is positioned in the groove such that the cam bushing may be held in a retracted position by preventing the long arm from following the groove.

9. A system comprising:

a cam follower having a short arm and a long arm;

a cam bushing having a back and a flat front, wherein the back includes:

a cam axle extending from the back, the cam axle having an aperture configured to receive the short arm such that the cam follower is securely held in the aperture by friction while permitting the cam follower to rotate about the short arm;

a cam sill extending from the back, wherein the cam sill has a curved surface having, opposing sides, wherein each side has a stop, wherein the curved surface describes an arc in relation to the aperture; and a cam track including:

a groove, the groove being configured to receive the long arm such that the long arm follows the groove;

a catch, the catch being positioned in the groove such that the cam bushing may be held in a retracted position by preventing the long arm from following the groove.

10. A system as in claim 9, wherein the cam axle is generally cylindrical in shape.

11. A system as in claim 9, wherein the aperture has substantially the same shape as the short arm.

12. A system as in claim 9, wherein the generally curved surface is positioned below the long arm and prevents the long arm from bending and reorienting.

13. A system as in claim 9, wherein the groove further comprises a catch path and a release path, the catch path capable of guiding the cam bushing to a retracted position and the release path capable of guiding the cam bushing to an extended position.

14. A system comprising:

a cam follower having a short arm and a long arm; and a cam bushing having a back and a flat front, wherein the back includes:

means for securely holding the short arm such that the cam follower is securely held yet permitted to rotate about the short arm when an external force is applied;

means for supporting the long arm such that the long arm is prevented from becoming disoriented, said means further including stop means for confining the rotational travel of the long arm about the means for supporting; and means for securely attaching to a media jack.

15. A system as in claim 14, wherein the means for securely holding the short arm further comprises a cam axle, wherein the cam axle extends out from the back and is generally cylindrical in shape.

16. A system as in claim 14, wherein the means for securely holding the short arm comprises an aperture, wherein the aperture is configured to receive the short arm and permit the short arm to rotate when an external force is applied to the long arm.

17. A system as in claim 14, wherein the means for supporting the long arm further comprises a cam sill extending from the back, wherein the cam sill is configured to allow the long arm to rotate about the short arm.

18. A system as in claim 14, wherein the means for supporting the long arm has a generally curved surface.

19. A system as in claim 14, wherein the means for securely attaching further comprises a compression fit between the means for securely holding the short arm and the media jack.

20. An apparatus comprising:

a cam follower having a short arm and a long arm; and a cam bushing having a back and a flat front, wherein the back includes:

a cam axle configured to receive the short arm such that the cam follower is securely held in the cam axle by friction while permitting the cam follower to rotate about the short arm; and a cam sill extending from the back, wherein the cam sill has a curved surface having opposing sides, wherein each side has an upward extending arm stop, whereby the long arm is prevented from rotating past each arm stop.

21. An apparatus as in claim 20, wherein the cam axle is generally cylindrical in shape and has an aperture extending into the cam axle.

22. An apparatus as in claim 21, wherein the aperture is substantially the same shape as the short arm.

23. An apparatus as in claim 21, wherein the aperture is configured to securely hold the short arm by friction while allowing the short arm to rotate when an external force is applied to the cam follower.

24. An apparatus as in claim 20, wherein the cam axle is configured to connect to a media jack via a compressed fit.

25. An apparatus as in claim 20, wherein the cam sill is positioned such that the long arm rests on the cam sill and is prevented from bending and reorienting.

26. An apparatus as in claim 20, wherein the generally curved surface describes an arc in relation to the aperture.

27. An apparatus as in claim 20, wherein the cam axle is configured to securely attach to a media jack.

28. An apparatus comprising:

a cam follower having a short arm and a long arm; and a cam bushing having a back and a flat front, wherein the back includes:

a cam axle having an aperture extending into the cam axle, wherein the aperture is configured to receive the short arm such that the cam follower is securely held in the aperture by friction, wherein the aperture permits the cam follower to rotate about the short arm, wherein the cam axle is configured to securely attach to a media jack; and a cam sill, wherein the cam sill extends out from the back, wherein the cam sill has a curved surface having opposing sides, wherein each side has an arm stop, wherein each arm stop extends up from the curved surface, whereby the long arm is prevented from rotating past each arm stop, wherein the generally curved surface describes an arc in relation to the aperture.

29. An apparatus as in claim 28, wherein the cam axle is generally cylindrical in shape and is configured to attach to the media jack via a compressed fit.

30. An apparatus as in claim 28, wherein the long arm rotates about the short arm and follows a path generally parallel to the generally curved surface.

31. A system comprising:

a cam follower having a short arm and a long arm; and a cam bushing having a back and a flat front, wherein the back includes:

means for securely holding the short arm such that the cam follower is securely held yet permitted to rotate about the short arm when an external force is applied; and means for supporting the long arm such that the long arm is prevented from becoming disoriented, said means further including stop means for confining the rotational travel of the long arm about the means for supporting.

32. A system as in claim 31, wherein the means for securely holding the short arm further comprises a cam axle extending from the back.

33. A system as in claim 31, wherein means for securely holding the short arm is generally cylindrical in shape and has an aperture, wherein the aperture is configured to securely receive the short arm and permit the short arm to rotate when an external force is applied to the cam follower.

34. A system as in claim 31, wherein the means for supporting the long arm further comprises a cam sill configured to allow the long arm to rotate about the short arm.

35. A system as in claim 31, wherein the means for supporting the long arm has a generally curved surface.

36. A system comprising:

a cam follower having a short arm and a long arm; and a cam bushing, wherein the cam bushing has a back and a flat front, wherein the back includes:

a cam axle extending from the back, wherein the cam axle is configured to receive the short arm such that the cam follower is securely held in the cam axle by friction while permitting the cam follower to rotate about the short arm; and a cam sill extending from the back, wherein the cam sill has a curved surface having opposing sides, wherein each side has a stop, wherein the curved surface describes an arc in relation to the aperture.

37. A system as in claim 36, wherein the cam axle is generally cylindrical in shape and has an aperture extending into the cam axle.

38. A system as in claim 36, wherein the aperture is substantially the same shape as the short arm.

39. A system as in claim 36, wherein the aperture is configured to securely hold the short arm by friction while allowing the short arm to rotate when an external force is applied to the cam follower.

40. A system as in claim 36, wherein the generally curved surface generally describes an arc in relation to the aperture.

41. A cam bushing comprising:

a body, wherein the body has a back and a flat front, wherein the back includes:

a cam axle extending from the back having an aperture; and a cam sill extending from the back, wherein the cam sill has a curved surface having opposing sides, wherein each opposing side has an upward extending arm stop.

42. A cam bushing as in claim 41, wherein the cam axle is substantially cylindrical in shape and has a length.

43. A cam bushing as in claim 42, wherein the aperture has a depth substantially the same as the length of the cam axle.

44. A cam bushing as in claim 41, wherein the aperture is configured to matingly receive a short arm such that the short arm is securely held by friction yet capable of rotating.

45. A cam bushing as in claim 41, wherein the generally curved surface generally describes an arc with respect to the aperture.

46. A cam bushing as in claim 41, wherein the cam sill is configured to permit a long arm to rotate next to the generally curved surface, wherein the long arm is connected to a short arm matingly connected with the aperture, wherein the long arm rotates about the short arm.

47. A cam bushing comprising:

a body, wherein the body has a back and a flat front, wherein the back includes:

a cam axle extending from the back having an aperture, wherein the cam axle is cylindrical in shape and has a length; and a cam sill extending from the back, wherein the cam sill has a curved surface having opposing sides, wherein each side has a stop, wherein the curved surface generally describes an arc in relation to the aperture.

48. A cam bushing as in claim 47, wherein the aperture has a depth substantially the same as the length of the cam axle.

49. A cam bushing as in claim 47, wherein the cam sill extends from the back substantially the same as the length of the cam axle.

50. A cam bushing as in claim 47, wherein the aperture is configured to matingly receive a short arm such that the short arm is securely held by friction, yet capable of rotating.

51. A cam bushing as in claim 47, wherein the cam sill is configured to permit a long arm to rotate about an axis defined by the short arm.

* * * * *

UNITED STATES PATENT AND TRADEMARK OFFICE

CERTIFICATE OF CORRECTION

PATENT NO. : 6,167,781 B1
DATED : January 2, 2001
INVENTOR(S) : Brent Madsen, Ryan Kunz, David Oliphant, Dexter Francis, and Josh Randall It is certified that error appears in the above-identified patent and that said Letters Patent is hereby corrected as shown below:

<u>Title page,</u>
Item [75], Inventors, line 3, after "Valley" insert -- City --
Item [57], ABSTRACT, line 9, after "cam axle through" change "with" to -- which --

<u>Column 3,</u>
Line 52, after "rotating in aperture 42" insert period
Line 61, after "portion of long arm" change "42" to -- 24 --

<u>Column 4,</u>
Line 5, before ", moves left towards" change "5l" (five el) to -- 51 -- (fifty-one)
Line 31, after "Cam sill" change "44" to -- 46 --
Line 52, after "suitable shape. In" change "sums" to -- sum, -- (sum comma)
Line 65, after "follower" change "46" to -- 20 --

<u>Column 5,</u>
Line 1, after "a depth 66" delete [depth]
Line 3, after "44, as shown in FIG." change "1" to -- 2 --
Line 4, after "fit with recess 62." change "Cam" to -- Axle --
Line 24, before "Long arm 24 is capable" insert period <u>Column 6,</u>
Line 5, after "retracted" insert -- position --
Line 25, after "curved surface having" delete comma Signed and Sealed this Ninth Day of April, 2002

*Attest:*

JAMES E. ROGAN
*Director of the United States Patent and Trademark Office*

*Attesting Officer*